United States Patent [19]
Kawano et al.

[11] Patent Number: 4,644,551
[45] Date of Patent: Feb. 17, 1987

[54] BURIED-TYPE SEMICONDUCTOR LASER

[75] Inventors: Hidoe Kawano; Isamu Sakuma, both of Tokyo, Japan

[73] Assignee: NEC Corporation, Tokyo, Japan

[21] Appl. No.: 661,477

[22] Filed: Oct. 16, 1984

[30] Foreign Application Priority Data

Oct. 17, 1983 [JP] Japan ................ 58-193804

[51] Int. Cl.⁴ .............................. H01S 3/19
[52] U.S. Cl. ...................... 372/45; 357/17; 372/46
[58] Field of Search ............ 372/45, 46; 357/17

[56] References Cited

U.S. PATENT DOCUMENTS 4,426,702  1/1984  Yamashita et al. ............ 372/45
4,481,631 11/1984  Henry et al. ................. 372/46

OTHER PUBLICATIONS

Kajimura et al, "(GaAl) As High Power Visible Lasers with Self-Aligned Strip Buried Heterostructure", Fourth International Conference on Integrated Optics and Optical Fiber Communication, Tokyo, Japan, Jun. 27-30, 1983, pp. 136-137.

Primary Examiner—James W. Davie
Attorney, Agent, or Firm—Sughrue, Mion, Zinn, Macpeak, and Seas

[57] ABSTRACT

A buried layer semiconductor laser includes a mesa stripe comprised of a multi-layer structure having successively over a substrate at least a first semiconductor cladding layer of a first conductivity type, a semiconductor optical waveguide layer of said first conductivity type, a semiconductor active layer, a second semiconductor cladding layer of a second conductivity type, and a third semiconductor cladding layer of the second conductivity type. The sides of the semiconductor optical waveguide layer are covered by a first semiconductor burying layer of the second conductivity type and having a refractive index the same as or smaller than the refractive index of the optical waveguide layer. A second semiconductor burying layer of the first conductivity type covers the sides of the active layer, the second cladding layer and the third cladding layer. The lateral width of the active layer and the second cladding layer are smaller than the lateral widths of the other layers of the multi-layer structure. In addition, the thickness of the third cladding layer is made substantially greater than the thickness of the second cladding layer while the specific resistivity and thermal resistance of the third cladding layer is made less than that of the second cladding layer. A method for fabricating such a buried layer semiconductor laser is also disclosed.

7 Claims, 7 Drawing Figures

BURIED-TYPE SEMICONDUCTOR LASER

BACKGROUND OF THE INVENTION

The present invention relates to a stripe buried semiconductor laser with current confinement structure.

A stripe buried semiconductor lasers are provided with a superior optical waveguide function as their active layer region is surrounded by substances having a lower refractive index. As the difference in refractive indices is set at a value higher than necessary in conventional stripe structure, oscillation in fundamental mode is effected when the stripe is less than 2 microns in width, but as the stripe becomes wider, the oscillation occurs in a higher order mode. The fundamental mode oscillation with such a narrow stripe inevitably limits its output typically to several mW or less.

An improved stripe buried semiconductor laser has been proposed to overcome the problem of low output encountered in the convenitonal buried semiconductor laser. In such a stripe buried structure, as will be described hereinafter, there is provided an optical waveguide layer in addition to the active layer. Semiconductor layers of lower refractive index surrounding the active layer completely confines injected carriers, and light is propagated in an optical waveguide layer which has a smaller refractive index than that of the active layer, thereby preventing oscillation in a higher order mode while maintaining single mode oscillation over a high output power range (See, for example, T. Kajimura et al., "(GaAl)As High Power Visible Lasers with Self-aligned Stripe Buried Heterostructure", Fourth International Conference on Integrated Optics and Optical Fiber Communication, June 27-30, 1983, Tokyo, Technical Digest, pp. 136-137.).

One example of prior art structure of the stripe buried semiconductor laser is shown in FIG. 1. In FIG. 1, the reference numeral 1 denotes an n-GaAs substrate, 2 an n-Al$_x$Ga$_{1-x}$As cladding layer ($0.3 \leq x \leq 0.35$), 3 an n-Al$_y$Ga$_{1-y}$As optical waveguide layer ($0.23 \leq y \leq 0.26$), 4 an Al$_{0.14}$Ga$_{0.86}$As active layer, 5 a p-Al$_w$Ga$_{1-w}$As cladding layer ($0.4 \leq w \leq 0.45$), 6 a p-Al$_{0.2}$Ga$_{0.8}$As electrode layer, 7 a p-Al$_{0.4}$Ga$_{0.6}$As burying layer, 8 an n-Al$_{0.4}$Ga$_{0.6}$As burying layer, 9 a p-electrode and 10 an n-electrode.

In such a structure, the application of a forward voltage between the p-electrode 9 and the n-electrode 10 injects a current into the Al$_{0.14}$Ga$_{0.86}$As active layer 4 to enable laser operations. As the p-Al$_{0.4}$Ga$_{0.6}$As burying layer 7 functions as a current confining layer, the current flowing into regions other than the mesa region can be effectively prevented, allowing efficient injection of current into the mesa and improving the laser oscillation efficiency. The n-Al$_y$Ga$_{1-y}$As optical waveguide layer 3 allows laser light to propagate therein. As a result, the effective difference in the refractive index in the transverse direction of the active region 4 becomes small enough to prevent higher order mode oscillation. In other words, the effect of confining the light is reduced and stabilized oscillation in fundamental mode can be obtained over a wider range of output power even with a laser having a wider stripe.

However, in a semiconductor laser of such a structure, in view of reliability, the active layer 4 must be kept at a distance from the ohmic layer of the p-electrode 9. This inevitably necessitates the p-Al$_w$Ga$_{1-w}$As cladding layer 5 to have a greater thickness. Further, the specific resistivity of the cladding layer 5 is greater because of relatively greater Al composition(w), and coupled with its greater thickness, the thermal resistance of the cladding layer becomes greater, hampering high output power oscillation. Another disadvantage is that such a thickness of the p-Al$_w$Ga$_{1-w}$As layer 5 having a greater Al composition provides a greater opportunity for its side surface to be oxidized prior to the second liquid phase epitaxial (LPE) crystal growth process, because the layer 5 is exposed to the air. The oxidized film on the surface hinders the growth, greatly deteriorating the uniformity and reproducibility of the second LPE crystal growth. In other words, it becomes difficult to uniformly grow the burying layers 7 and 8 on the side surface of the mesa. If, however, the p-Al$_w$Ga$_{1-w}$As layer 5 is made thinner and the p-Al$_{0.2}$Ga$_{0.8}$As electrode layer 6 thicker, the boundary area between the p-Al$_{0.2}$Ga$_{0.8}$As electrode layer 6 and the n-Al$_{0.4}$Ga$_{0.6}$As burying layer 8 increases, whereby the p-n junction potential between the two layers becomes small and the leakage current flowing in the regions other than the mesa region increases.

SUMMARY OF THE INVENTION

It is an object of the present invention to obviate the defects found in the conventional semiconductor lasers and to provide a buried semiconductor laser which has a reliable current confining effect, enables high power operation in fundamental-transverse-mode-stabilized oscillation and is easy to manufacture at improved reproducibility.

In order to achieve the above object, the semiconductor laser according to the present invention has a multilayer stripe structure which comprises, at least in successive lamination on a semiconductor substrate of a first conductivity type, a first semiconductor layer of the first conductivity type, a second semiconductor layer of the first conductivity type having a refractive index greater than that of the first layer, an active layer having a refractive index greater than that of the second semiconductor layer, a third semiconductor layer of a second conductivity type having a refractive index smaller than that of the first semiconductor layer, and a fourth semiconductor layer of the second conductivity type having an refractive index identical with that of the first semiconductor layer. The present invention is characterized in that the side of the second semiconductor layer is provided with semiconductor layers of second conductivity type having a refractive index identical with or smaller than the second layer and that there are provided on the sides of the active layer and the third and fourth semiconductor layers a semiconductor layer of the first conductivity type having a refractive index smaller than said active layer. In other words, the semiconductor laser of the present invention consists of a laminated structure in which a p-Al$_x$Ga$_{1-x}$As third cladding layer having the same Al composition as the n-Al$_x$Ga$_{1-x}$As first cladding layer 2 is interposed between the p-Al$_w$Ga$_{1-w}$As layer 5 and the p-Al$_{0.2}$Ga$_{0.8}$As electrode layer 6.

DETAILED DESCRIPTION OF THE PREFERRED EMBODIMENT

One embodiment according to the present invention will now be described in detail referring to the accompanying drawings.

Figure 1:
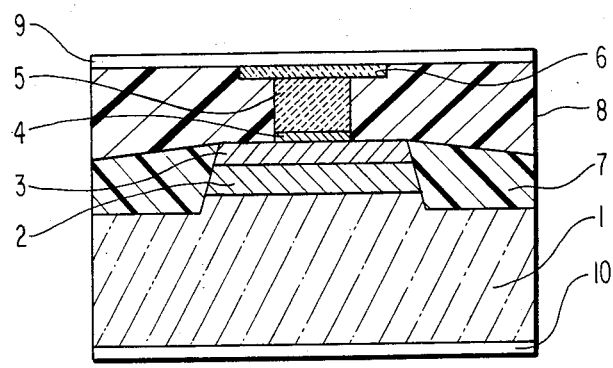
FIG. 1 is a cross sectional view of a conventional buried semiconductor laser.
Figure 2:
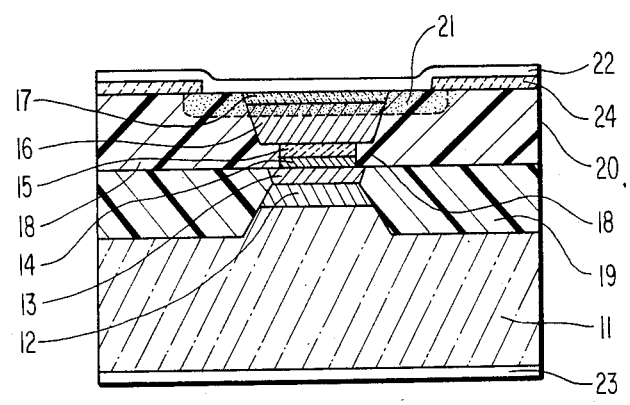
FIG. 2 is a cross sectional view of one embodiment of the semiconductor laser according to the present invention.
Figure 3A:
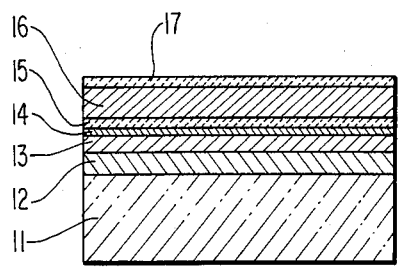
FIGS. 3A through 3E are cross sectional views to show the structure of the present invention at each stage of the manufacturing process.

Referring to FIG. 2 which shows a cross section of the preferred embodiment, the structure is obtained by the following process. In FIG. 3A using the first liquid phase epitaxial growth process, an n-GaAs substrate 11 is grown thereon with an n-$Al_{0.4}Ga_{0.6}As$ first cladding layer 12 (refractive index $n_{12}=3.38$), an n-$Al_{0.35}Ga_{0.65}As$ optical waveguide layer 13 (refractive index $n_{13}=3.41$), an $Al_{0.11}Ga_{0.89}As$ active layer 14 (refractive index $n_{14}=3.60$), a p-$Al_{0.5}Ga_{0.5}As$ second cladding layer 15 ($n_{15}=3.32$), a p-$Al_{0.4}Ga_{0.6}As$ third cladding layer 16 ($n_{16}=3.38$), and a p-$Al_{0.15}Ga_{0.85}As$ electrode layer 17 ($n_{17}=3.49$). The thickness of these layers are respectively 1.5 microns, 0.5 micron, 0.05 micron, 0.3 micron, 1.0 micron and 0.5 micron. The differences from the conventional multi-layer structure of prior art semiconductor lasers lie in that the p-$Al_{0.4}Ga_{0.6}As$ cladding layer 16 (FIG. 2) is formed between the p-$Al_wGa_{1-w}As$ layer 5 and the p-$Al_{0.2}Ga_{0.8}As$ electrode layer 6 (FIG. 1) and that the p-$Al_{0.5}Ga_{0.5}As$ layer 15 (corresponding to the p-$Al_wGa_{1-w}As$ layer 5 in FIG. 1) has a thickness as small as 0.3 micron.

Figure 3D:
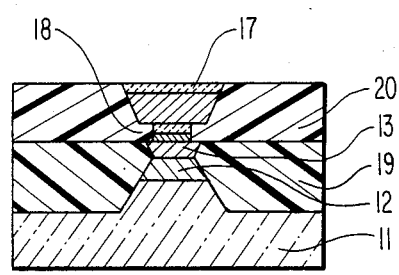
Figure 3B:
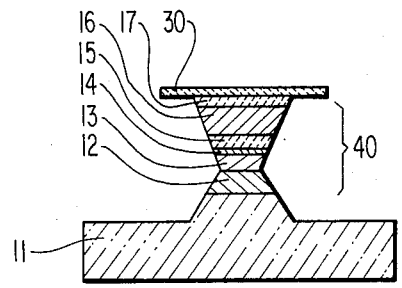
Figure 3E:
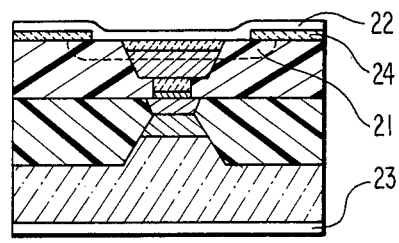
Figure 3C:
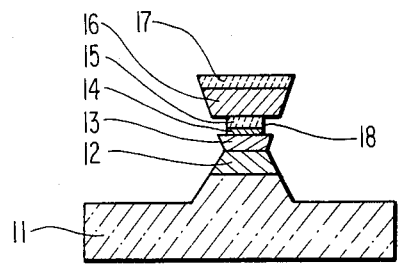

Subsequently, a mask 30 is formed on the layer 17, and using $H_2O_2+H_3PO_4+3CH_3OH$ etchants, a mesa etching is carried out in a stripe to reach the n-GaAs substrate 11, whereby a mesa 40 having an active region is formed (FIG. 3B). Using HF solution, etching is continued for one minute at a room temperature to selectively etch the p-$Al_{0.5}Ga_{0.5}As$ second cladding layer 15 alone for a depth of 0.3 micron from both sides of the mesa. Using $H_2O_2+H_3PO_4+3CH_3OH$ etchants again, the exposed portion of the $Al_{0.11}Ga_{0.89}As$ active layer 14 is lightly etched for 10 to 20 seconds at room temperature to form dents 18 of the 0.3 micron depth in opposite mesa sides (FIG. 3C). Then, during the second liquid phase epitaxial growth process, a p-$Al_{0.4}Ga_{0.6}As$ burying layer 19 ($n_{19}=3.38$), an n-$Al_{0.4}Ga_{0.6}As$ burying layer 20 ($n_{20}=3.38$) are consecutively formed in a manner to surround the mesa (FIG. 3D). The epitaxial growth conditions are, for the p-burying layer 19, that growth temperature is 780° C., supercooling 2°–7° C., cooling rate 0.2° C./min., and growth time 5 minutes; and for the n-burying layer 20, growth temperature of 779° C., supercooling of 2°–7° C., cooling rate of 0.2° C./min., and growth time of 20 minutes. Because of the dents 18 on the mesa sides, the p-$Al_{0.4}Ga_{0.6}As$ burying layer 19 which is the first layer to grow in the process will not grow beyond the upper surface of the waveguide layer 13 but will be limited up to the surface thereof. Therefore, as shown in FIG. 2, the p-$Al_{0.4}Ga_{0.6}As$ burying layer 19 can be selectively formed on the mesa sides of the n-$Al_{0.4}Ga_{0.6}As$ first cladding layer 12 and n-$Al_{0.35}Ga_{0.65}As$ optical waveguide layer 13. After the epitaxial growth, an $SiO_2$ film 24 is formed over the surface of the semiconductor layers 20 and 17 and a window is etched at the center to form a p-impurity-diffusion layer 21 (Zn diffusion), a p-electrode 22 and an n-electrode 23 (FIG. 3E). It is then cleaved to make the resonator 300 microns in length and to form the buried semiconductor laser shown in FIG. 2.

In the structure according to the present invention the p-$Al_{0.4}Ga_{0.6}As$ burying layer 19 functions as the current confining layer. Further, since the p-$Al_{0.4}Ga_{0.6}As$ third cladding layer 16 is formed in the mesa region, the p-n junction potential between the p-$Al_{0.4}Ga_{0.6}As$ third cladding layer 16 formed on the mesa sides and the n-$Al_{0.4}Ga_{0.6}As$ burying layer 20 becomes greater and the leakage current into regions other than the mesa can be reduced. As a result, highly efficient laser oscillation at a low oscillation threshold current can be realized and the fundamental-transverse-mode oscillation can be maintained over a greater current region even if the active layer has a width of 3 microns or larger. Still further, the p-$Al_{0.5}Ga_{0.5}As$ layer 15 which has a greater Al composition and a higher thermal resistance can be made thin, so that the heat radiation characteristics can be improved and laser oscillation can be facilitated under high output operation at high temperatures. As the third cladding layer having a smaller Al composition is exposed, it is less prone to be oxidized, eliminating the problem of nonuniform growth and improving the reproducibility and uniformity of the growth.

It should be understood that although an AlGaAs-GaAs semiconductor is employed in the above embodiment, semiconductors of other compounds such as InGaAsP-InP may also be used.

What is claimed is:

1. In a buried semiconductor laser diode having a resonant cavity for oscillation and a pair of electrodes for injecting current to said laser diode-for excitation, said laser diode comprising: a mesa stripe having a multi-layer structure which successively includes over a semiconductor substrate of a first conductivity type, at least, a first semiconductor layer of the first conductivity type, a second semiconductor layer of the first conductivity type having a refractive index greater than that of the first semiconductor layer, an active layer having a refractive index greater than that of the second semiconductor layer, and a third semiconductor layer of a second conductivity type having a refractive index smaller than that of said first semiconductor layer and a fourth semiconductor layer of the second conductivity type having a refractive index substantially identical with that of the first semiconductor layer, the lateral width of the active layer and the third semiconductor layer being smaller than the width of the other layers of the multi-layer structure in the mesa stripe; a semi-conductor layer, provided on the sides of the second semiconductor layer, of the second conductivity type having a refractive index identical with or smaller than that of the second semiconductor layer; and a semiconductor layer, provided on the sides of the active, the third and the fourth semiconductor layers, of the first conductivity type having a refractive index smaller than that of the active layer.

2. The buried semiconductor laser as claimed in claim 1 wherein:
said first semiconductor layer is an n-$Al_{0.4}Ga_{0.6}As$ first cladding layer; said second semiconductor layer is an n-$Al_{0.35}Ga_{0.65}As$ optical waveguide layer; said active layer is a $Al_{0.11}Ga_{0.89}As$ active layer; said third semiconductor layer is a p-$Al_{0.5}Ga_{0.5}As$ second cladding layer, said fourth semiconductor layer is/p-$Al_{0.4}Ga_{0.6}As$ third cladding layer, said semiconductor layer provided on the sides of the second semiconductor layer is a p-$Al_{0.4}Ga_{0.6}As$ burying layer, and said semiconductor layer provided on the sides of the active, third and fourth semiconductor layers is an n-Al$_{0.4}$Ga$_{0.6}$As burying layer.

3. The buried semiconductor laser as claimed in claim 1 wherein;
said fourth semiconductor layer is substantially thicker than said third semiconductor layer.

4. The buried semiconductor laser as claimed in claim 3 wherein said third semiconductor layer 0.3 micron or greater.

5. The buried semiconductor laser as claimed in claim 2 wherein;
the first semiconductor layer has a refractive index $n_{12}=3.38$; said second semiconductor layer has a refractive index $n_{13}=3.41$; said active layer has a refractive index $n_{14}=3.60$; said third semiconductor layer has a refractive index $n_{15}=3.32$; said fourth semiconductor layer has a refractive index $n_{16}=3.38$; said semiconductor layer provided on the sides of said second semiconductor layer has a refractive index $n_{19}=3.38$; and said semiconductor layer provided on the sides of said active, third and fourth semiconductor layers has a refractive index $n_{20}=3.38$.

6. The buried semiconductor laser as claimed in claim 5 further including a p-Al$_{0.15}$Ga$_{0.85}$As electrode layer over said fourth semiconductor layer, and a p-electrode over said electrode layer and an n-electrode on the surface of said substrate opposite the surface thereof over which said multi-layer structure is formed.

7. The buried semiconductor laser as claimed in claim 6, wherein; said first semiconductor layer is 1.5 microns thick, said second semiconductor layer is 0.5 micron thick, said active layer is 0.05 micron thick, said third semiconductor layer is 0.3 micron thick, and said fourth semiconductor layer is 1.0 micron thick.

* * * * *

UNITED STATES PATENT AND TRADEMARK OFFICE
CERTIFICATE OF CORRECTION

PATENT NO. : 4,644,551
DATED : February 17, 1987
INVENTOR(S) : Hideo KAWANO; Isamu SAKUMA It is certified that error appears in the above-identified patent and that said Letters Patent is hereby corrected as shown below:

Title Page, Item 75 delete "Hidoe", and insert therefor --Hideo--

Column 4, Line 30, delete "diode-for", and insert therefor

--diode for--

Column 4, Line 64, after "is", delete "/", and insert therefor

-- a --.

Signed and Sealed this

Twentieth Day of October, 1987

Attest:

DONALD J. QUIGG

*Attesting Officer*  *Commissioner of Patents and Trademarks*